United States Patent
Onishi et al.

(10) Patent No.: US 7,511,511 B2
(45) Date of Patent: Mar. 31, 2009

(54) SPECIFIC ABSORPTION RATE MEASURING SYSTEM, AND A METHOD THEREOF

(75) Inventors: Teruo Onishi, Yokohama (JP); Ryo Yamaguchi, Zushi (JP); Shinji Uebayashi, Yokohama (JP); Tadao Nagatsuma, Atsugi (JP); Naofumi Shimizu, Atsugi (JP); Hiroyoshi Togo, Atsugi (JP)

(73) Assignees: NTT DoCoMo, Inc., Tokyo (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 11/754,683

(22) Filed: May 29, 2007

(65) Prior Publication Data
US 2007/0236229 A1    Oct. 11, 2007

Related U.S. Application Data

(63) Continuation of application No. 11/263,946, filed on Nov. 2, 2005, now abandoned.

(30) Foreign Application Priority Data

Nov. 2, 2004    (JP)    ............... 2004-319387

(51) Int. Cl.
*G01N 22/00*    (2006.01)
*G01R 29/08*    (2006.01)

(52) U.S. Cl. .............. 324/632; 324/631; 324/247; 343/703

(58) Field of Classification Search .......... 324/632, 324/631
See application file for complete search history.

(56) References Cited

U.S. PATENT DOCUMENTS

| 6,919,845 | B2 * | 7/2005 | Ozaki et al. ............. 343/703 |
| 2001/0000930 | A1 | 5/2001 | Kim |
| 2007/0236229 | A1 | 10/2007 | Onishi et al. |

FOREIGN PATENT DOCUMENTS

| JP | 2004-12468 | 1/2004 |
| WO | WO 01/86311 A1 | 11/2001 |

OTHER PUBLICATIONS

U.S. Appl. No. 11/873,934, filed Oct. 17, 2007, Kiminami et al.

(Continued)

*Primary Examiner*—Diego Gutierrez
*Assistant Examiner*—John Zhu
(74) *Attorney, Agent, or Firm*—Oblon, Spivak, McClelland, Maier & Neustadt, P.C.

(57) ABSTRACT

A biological tissue equivalent phantom unit to be used by the specific absorption rate measuring system for evaluating absorption of electromagnetic wave energy includes a biological tissue equivalent phantom for absorbing an electromagnetic wave. In addition, two or more electro-optical crystals are arranged at two or more measurement points in the biological tissue equivalent phantom. The electro-optical crystals have a dielectric constant that is approximately equal to that of the biological tissue equivalent phantom. Two or more optical fibers are laid in the biological tissue equivalent phantom for optically connecting each of the electro-optical crystals to an external destination.

1 Claim, 5 Drawing Sheets

OTHER PUBLICATIONS

M. Berwick, et al., "High Precision Electromagnetic Field Sensors For Monitoring Communications Devices", Singapore ICCS, Conference Proceedings, XP-010150094, vol. 3, Nov. 14, 1994, pp. 944-948.

S. Wakana, et al., "Novel Electromagnetic Field Probe Using Electro/Magneto-Optical Crystals Mounted on Optical-Fiber Facets For Microwave Circuit Diagnosis", 2000 IEEE MTT-S International Microwave Symposium Digest, XP-000967537, vol. 3 of 3, Jun. 11, 2000, pp. 1615-1618.

Volker Hombach, et al., "The Dependence of EM Energy Absorption Upon Human Head Modeling at 900 MHz", IEEE Transactions on Microwave Theory and Techniques, IEEE Service Center, XP-002125147, vol. 44, No. 10, Oct. 1996, pp. 1865-1873.

A Cruden et al., Current and Voltage Measurement Using Optical Crystal Based Devices, Nov. 2, 1994, Low Frequency Power Measurement and Analysis (Digest No. 1994/203), IEE Colloguium, pp. 8/1-8/5.

* cited by examiner

DIFFERENCE BETWEEN SPECIFIC INDUCTIVE CAPACITIES OF PHANTOM AND ELECTRO-OPTICAL CRYSTAL $\left(\dfrac{\varepsilon_p - \varepsilon_c}{\varepsilon_0}\right)$

SPECIFIC ABSORPTION RATE MEASURING SYSTEM, AND A METHOD THEREOF

CROSS-REFERENCE TO RELATED APPLICATIONS

This application is a Continuation of U.S. patent application Ser. No. 11/263,946, filed Nov. 2, 2005, and claims priority to Japanese Patent Application No. 2004-319387, filed Nov. 2, 2004, the entire contents of these applications are incorporated herein by reference.

BACKGROUND OF THE INVENTION

1. Field of the Invention

The present invention relates to a biological tissue equivalent phantom unit (phantom unit) used by a specific absorption rate measuring system for evaluating absorption of electromagnetic wave energy; a specific absorption rate measuring system using the phantom unit; and a method thereof.

2. Description of the Related Art

In recent years and continuing, requirements are increasing for quantitatively evaluating a thermal effect caused by an electromagnetic wave emitted by a wireless radio transmitter; and a system that is capable of accurately and swiftly measuring a specific absorption rate (SAR), which is an index of the reaction of the electromagnetic wave on a living body, such as a human, is desired.

A SAR value is proportional to an electric field ($|E|^2$), and is often used for evaluating the energy absorbed by a human body when a cellular phone is used near the human body, SAR being defined by the following Equation 1.

$$SAR = \sigma |E|^2 / \rho \quad \text{[Equation 1]}$$

Here, $\sigma$ and $\rho$ represent conductivity [S/m] and density [kg/m3], respectively, of the biological tissue equivalent phantom.

Usually, when measuring SAR, an electric-field measuring method is used, wherein a short dipole detects an electric field generated in a medium (live body), which electric field is converted into SAR using Equation 1.

FIG. 1 shows a conventional specific absorption rate measuring system 100 that includes a simulated body (phantom) 101 that simulates an electric constant of a human body with liquid, a container 102 into which the liquid is provided, a probe 103 for detecting an electric field, a probe scanner 104, a signal cable 105, an electric field detection apparatus 106, and a processor apparatus 107 for measurement operations and data analysis.

Here, the electric field generated in the phantom is measured by arranging a measuring target instrument 108, such as a cellular phone, near the specific absorption rate measuring system 100 as shown in FIG. 1. The probe 103 for detecting the electric field is scanned in three dimensions by the probe scanner 104, and SAR is measured.

FIG. 2 shows another specific absorption rate measuring system 200 that includes a phantom 121 that simulates the electric constant of the human body with a solid-state object, a probe 122 for detecting the electric field, a cable 123 for signal transmissions, an electric-field detection apparatus 124, a processor apparatus 125 for measurement operations and data analysis, and a scanner 126.

The electric field generated in the phantom is measured by arranging a measuring target instrument 127, such as a cellular phone, near the specific absorption rate measuring system 200 as shown in FIG. 2. However, unlike the conventional example shown by FIG. 1, the cellular phone 127 is moved by the scanner 126, and SAR is measured.

In either of the conventional examples, the probe 103 or 122, as applicable, for detecting the electric field is required. Each of the probes 103 and 122 for detecting the electric field includes a detecting element 110 as shown in detail on the right-hand side of FIG. 1. There, an electric field is detected by short dipole elements 111 and 112. Then, the electric field is detected by a Schottky diode 113 inserted in a gap, and a detected result in the form of an electrical signal is provided to the corresponding electric-field detection apparatuses 106 and 124 through high resistance wires 114. That is, the Schottky diode 113 detects a voltage generated by the short dipole elements 111, 112 formed with conductors, the length of which is about 2 to 5 mm.

However, since the short dipole antenna and the high resistance wires, both being conductive, are present in the electric field to be measured, the electromagnetic field distribution near the detecting element 110 is disturbed. This is a problem of the electric-field measuring method. Further, since it is difficult to reduce the length of the dipole elements 111, 112, it is expected that the disturbance will become greater as the frequency becomes higher.

Then, in an attempt to reduce the disturbance to the electromagnetic field generated by the measuring target 108, 127 (e.g. a cellular phone), the disturbance being due to the probe 104, 122 for detecting the electric field, an electric-field sensor 300 using an optical waveguide type modulator and a laser beam has been developed as shown in FIG. 3.

The electric-field sensor 300 includes a laser luminous source 131, an electric-field probe 132, an optical waveguide type modulator 133, a minute dipole 134 that consists of metal, and an optical receiving unit 135.

Since the electric-field sensor 300 is configured only by dielectric materials, except for the minute dipole 134, it is capable of measuring the electric field with a precision that is higher than the electric-field detecting methods that use the high resistance wires.

Nevertheless, since the short dipole is used according to the electric-field measuring method using the electric-field sensor 300, wherein the optical waveguide type modulator and the laser beam are used, the disturbance remains, although the disturbance becomes smaller than in the case of the electric-field measuring methods using the high resistance wires. Further, since the probe for detecting the electric field, or a 3-dimensional electric-field sensor, is moved in the liquid phantom for measuring SAR, the liquid (a phantom solvent) is agitated, and noise is generated by vibration of the probe or sensor. If a time until the solvent settles into a steady state is waited for in order to avoid the noise, measurement will take a long time. If two or more electric-field sensors are arranged in two dimensions or three dimensions in the phantom in order to shorten the measuring time, the aggregate of the sensors (short dipoles) will behave as a conductor, and will generate a great disturbance to the electromagnetic field to be measured. Consequently, a SAR distribution that is different from actual may be measured, which is a problem.

SUMMARY OF THE INVENTION

The present invention provides a specific absorption rate measuring system, a biological tissue equivalent phantom unit, and a method thereof that substantially obviate one or more of the problems caused by the limitations and disadvantages of the related art.

Features of the present invention are set forth in the description that follows, and in part will become apparent from the description and the accompanying drawings, or may be learned by practice of the invention according to the teachings provided in the description. Problem solutions provided by the present invention will be realized and attained by a specific absorption rate measuring system, a biological tissue equivalent phantom unit, and a method thereof particularly pointed out in the specification in such full, clear, concise, and exact terms as to enable a person having ordinary skill in the art to practice the invention.

To achieve these solutions and in accordance with the purpose of the invention, as embodied and broadly described herein, the invention provides a specific absorption rate measuring system, a biological tissue equivalent phantom unit, and a method thereof as follows.

An aspect of the present invention provides a biological tissue equivalent phantom unit that is to be used by a specific absorption rate measuring system for evaluating absorption of electromagnetic wave energy. The biological tissue equivalent phantom unit includes a biological tissue equivalent phantom for absorbing an electromagnetic wave, two or more electro-optical crystals that have a dielectric constant approximately equal to the dielectric constant of the biological tissue equivalent phantom, the electro-optical crystals being arranged at two or more measurement points set up in the biological tissue equivalent phantom, and two or more optical fibers provided in the biological tissue equivalent phantom for connecting each of the electro-optical crystals to an external destination.

According to another aspect of the present invention, a high dielectric constant material is applied to the surface of the optical fibers of the biological tissue equivalent phantom unit.

Another aspect of the present invention provides a specific absorption rate measuring system for evaluating the absorption of the electromagnetic wave energy using the biological tissue equivalent phantom unit. The specific absorption rate measuring system includes a luminous source for emitting a light, a polarization regulator for adjusting a polarization state of the light emitted by the luminous source, an optical-path switcher for switching the light output by the polarization regulator to each electro-optical crystal one by one, and a specific absorption rate measuring unit for measuring a specific absorption rate by detecting the light reflected by the electro-optical crystal.

Another aspect of the present invention provides a specific absorption rate measuring method of evaluating absorption of the electromagnetic wave energy using the biological tissue equivalent phantom that receives irradiation of the electromagnetic wave. The specific absorption rate measuring method includes a step of arranging two or more electro-optical crystals that have a dielectric constant approximately equal to that of the biological tissue equivalent phantom to two or more measuring points in the biological tissue equivalent phantom, a step of sequentially providing the light to each of the electro-optical crystals through the optical-path switcher, the light being irradiated by the luminous source, where the polarization state of the light is adjusted, a step of reflecting the light that is provided to the electro-optical crystals, a step of leading the light reflected from the electro-optical crystal to an analyzer, and a step of converting the light that passes the analyzer into an electrical signal by a photodetector, and obtaining the specific absorption rate.

According to another aspect of the present invention, the step of reflecting the light that is provided to the electro-optical crystals of the specific absorption rate measuring method is a step of reflecting the light by a dielectric reflective film prepared on a surface countering a surface, through which the light is provided, of the electro-optical crystal.

According to another aspect of the present invention, the step of sequentially providing the light to each of the electro-optical crystals through the optical-path switcher of the specific absorption rate measuring method is a step of sequentially providing the light to each of the electro-optical crystals by selecting an optical fiber by the optical-path switcher, wherein the optical-path switcher is connected to each of the electro-optical crystals.

According to another aspect of the present invention, as for the specific absorption rate measuring method, a high dielectric constant material is applied to the surface of the optical fiber such that the equivalent dielectric constant of the optical fiber becomes substantially equal to the dielectric constant of the biological tissue equivalent phantom.

As described above, according to the present invention, since the electric-field detecting element is constituted by nonmetallic materials, it is possible to measure the SAR distribution without the disturbance that is generated in the case of the conventional technology. Further, since the electro-optical crystals having a dielectric constant approximately equal to that of the phantom are used as a sensor head, reflection due to difference of the dielectric constants is reduced, and the SAR distribution can be more accurately measured. Furthermore, since spatial resolution of the measurement is proportional to a diameter of a beam of the light that penetrates the electro-optical crystal, the spatial resolution can be raised, theoretically, to as small as the wavelength of the light (several μm). Furthermore, since a change in a refractive index of the electro-optical crystal at the measuring point depends on deviation of a dipole that follows the electromagnetic wave, the SAR measurement is available in a wide band range, from the MHz band to the THz band.

According to the present invention, disturbance of the electric field in the electro-optical crystal by interface reflection is reduced, and the influence of the interface reflection on the electromagnetic field near the electro-optical crystals is reduced by using the electro-optical crystal that has a dielectric constant approximately equal to that of the phantom. Therefore, the specific absorption rate measuring system capable of obtaining an accurate SAR distribution is realized.

DESCRIPTION OF THE PREFERRED EMBODIMENTS

In the following, embodiments of the present invention are described with reference to the accompanying drawings, wherein common reference numbers are assigned to items that have the same functions, and the descriptions are not repeated.

Figure 1:
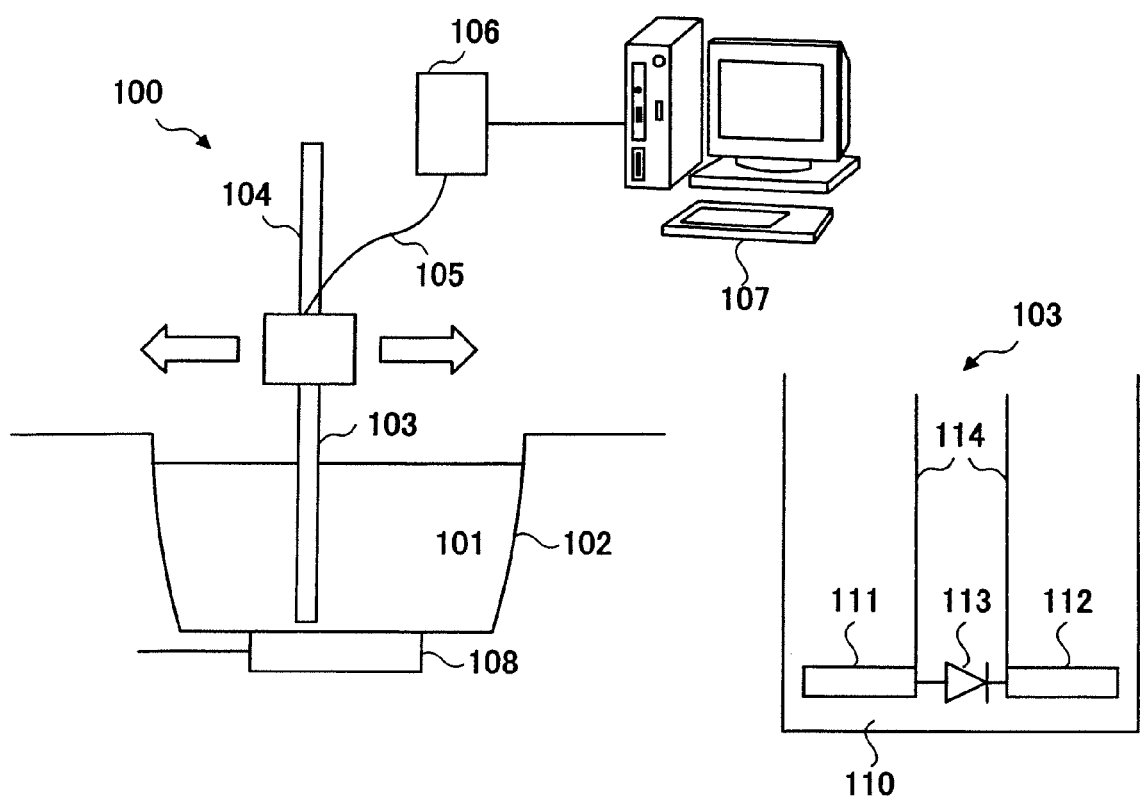
FIG. 1 is a schematic diagram of a conventional specific absorption rate measuring system 100.
Figure 2:
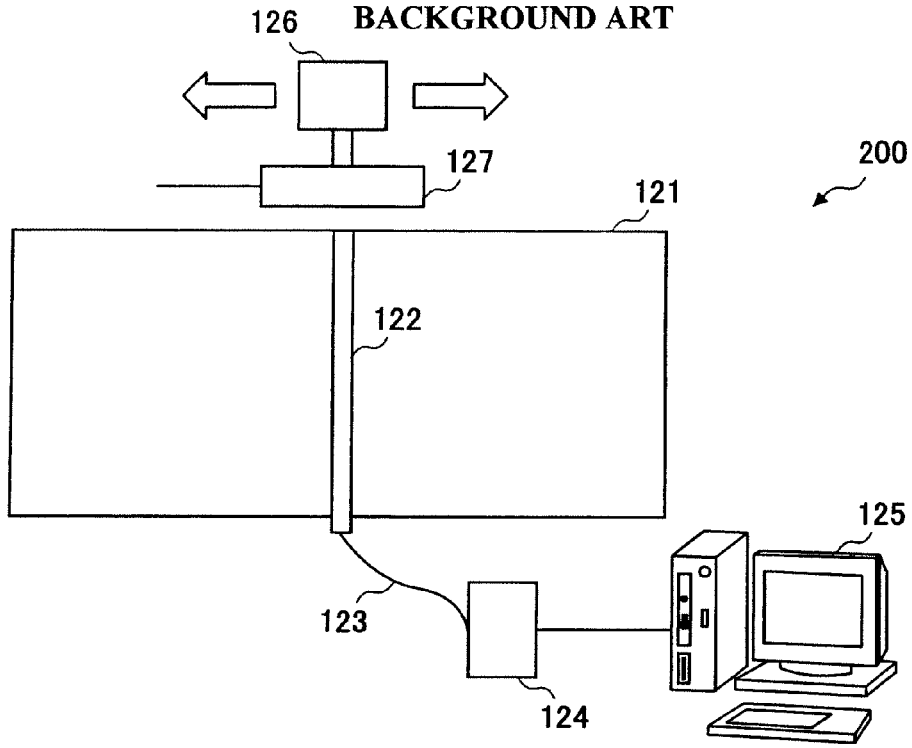
FIG. 2 a schematic diagram of another conventional specific absorption rate measuring system 200.
Figure 3:
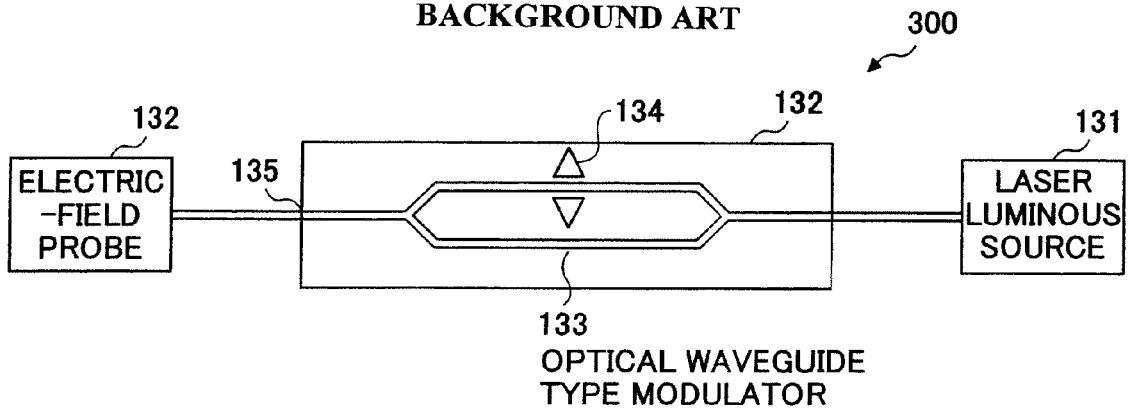
FIG. 3 is a schematic diagram of another conventional specific absorption rate measuring system 300 using an optical waveguide type modulator, a laser beam, and an electric-field sensor.
Figure 4:
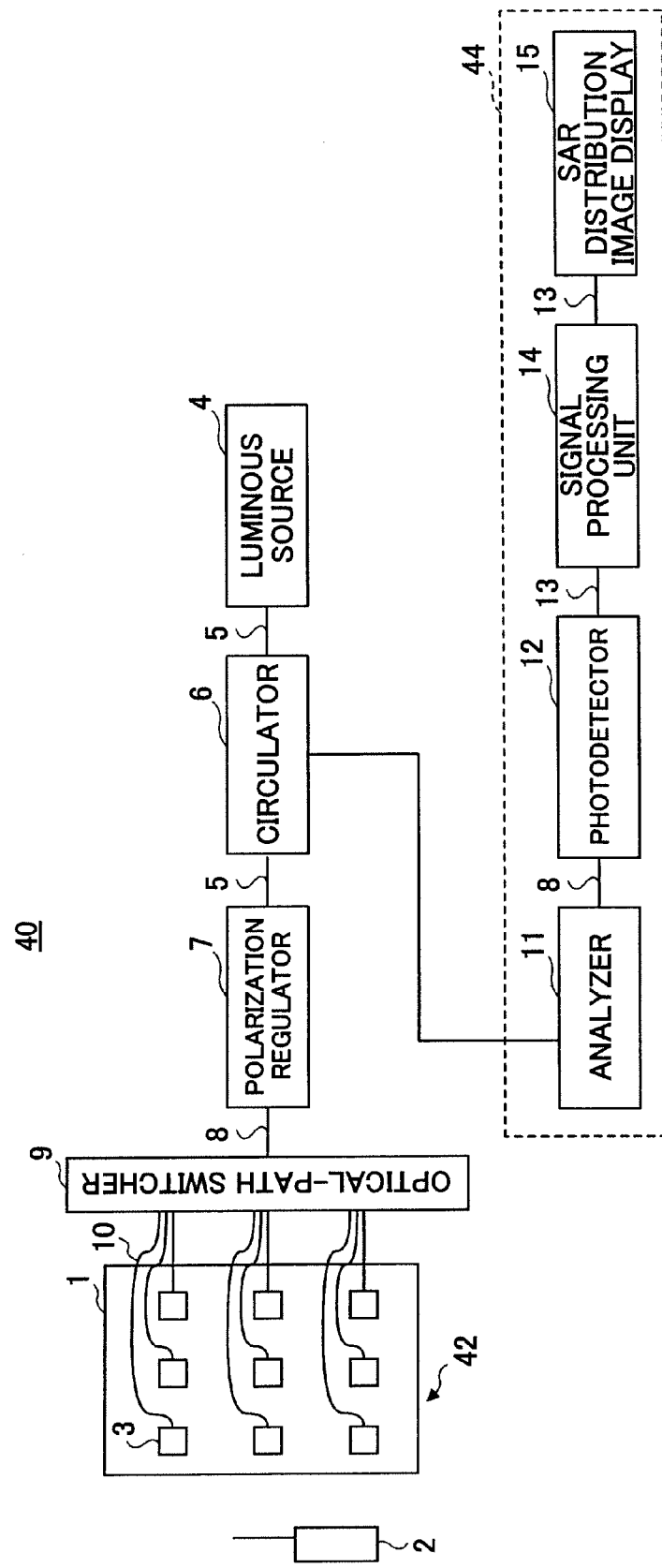
FIG. 4 is a block diagram of a specific absorption rate (SAR) measuring system according to an embodiment of the present invention.

FIG. 4 is a block diagram of a specific absorption ratio measuring system 40 according to the embodiment of the present invention. The specific absorption rate measuring system 40 includes a biological tissue equivalent phantom unit 42 that is constituted by a simulated human body (phantom) 1 consisting of liquid, gel, a solid-state object, etc., for simulating the electric constant of the human body, electro-optical crystals 3 that have a dielectric constant approximately equal to that of the phantom 1, and bare fibers 10.

The specific absorption rate measuring system 40 further includes
- an electromagnetic wave generator 2 such as a cellular phone,
- a linearly polarized luminous source 4 such as DFB-LD,
- a polarization maintenance fiber (PMF) 5,
- a circulator 6,
- a polarization regulator 7 that includes a ¼ wave plate and a ½ wave plate, single mode fibers (SMF) 8,
- an optical-path switcher 9 that is formed by MEMS technology and PLC technology, and
- a specific absorption rate measuring unit 44.

The specific absorption rate measuring unit 44 includes an analyzer 11, a photodetector 12, an electrical signal line 13, a signal processing unit 14, and a SAR distribution image display 15.

The specific absorption rate measuring system 40 is for measuring an electric field in the phantom 1 using the electro-optical crystals 3, the electric field being generated by the electromagnetic wave generator 2 (such as a cellular phone) arranged near the phantom 1, as shown in FIG. 4.

The linearly polarized light irradiated by the luminous source 4 is provided to the polarization regulator 7 via the circulator 6 and the polarization maintenance fiber (PMF) 5. The polarization regulator 7 changes the polarization of the linearly polarized light into a predetermined polarization state, and outputs the light.

The polarization state is determined by a crystallographic axis of the electro-optical crystal 3 arranged in the phantom 1 and a vibrating direction of the electric field generated by the electromagnetic wave generator 2. For example, when detecting an electric field that vibrates in parallel to the y-axis using CdTe, which is a lead marcasite type crystal, crystallographic faces (001), (100), and (010) of CdTe are perpendicularly arranged to the y, x, and the z axes, respectively; or to the y, z, and x axes, respectively; and the polarization regulator 7 is adjusted so that the polarization axis of the linear polarization or an elliptical polarization may become parallel to the x axis or the z axis.

The light, the polarization of which has been adjusted, is transmitted via the single mode fiber (SMF) 8 to the optical-path switcher 9, then to the electro-optical crystals 3.

The light is reflected by a dielectric reflective film prepared on a surface of the electro-optical crystal 3, the surface countering a surface through which the light is provided, and the light goes back along the incidence path. When the light goes back along the incidence path within the electro-optical crystal 3, a phase difference arises between components of the predetermined polarization due to a refractive-index change (Pockels effect) that is proportional to the field strength to the first power that is applied, and the polarization state is changed, i.e., polarization modulation occurs.

When CdTe is arranged, e.g., as described above, a phase difference Γ arises between polarization components that are parallel to the x axis and the z axis, the phase difference F being expressed by the following Equation 2.

$$\Gamma = (2\pi/\lambda) n_0^3 r_{41} E d \qquad \text{[Equation 2]}$$

Here, $\lambda$, $n_0$, $r_{41}$, E, and d represent the wavelength [m] of the incident light, the refractive index of the electro-optical crystal 3, the Pockels constant [m/V], field strength [V/m], and the length [m] of the electro-optical crystal 3 in a direction of the oscillation of the electric field, respectively.

The light that is reflected and polarization-modulated reaches the circulator 6 through the optical-path switcher 9 and the polarization regulator 7; then, the light is branched to the analyzer 11 by the circulator 6. The modulation component of the branched light is taken out by the analyzer 11, and is converted into an electrical signal by the photodetector 12. The amplitude of the electrical signal is proportional to the field strength of the electromagnetic wave that is measured. The amplitude of the electrical signal is converted into a SAR value by the signal processing unit 14. Such values, with position information attached, constitute a SAR distribution that can be displayed by the SAR distribution image display 15.

According to the electric-field measuring method, the specific absorption rate (SAR) is defined by Equation 1. According to the present embodiment, by using the specific absorption rate measuring system 40, SAR can be defined by the following Equation 3, based on Equations 1 and 2.

$$SAR = \sigma K |\Gamma^2|/\rho \qquad \text{[Equation 3]}$$

Here, K is a constant determined by the crystallographic axis of the electro-optical crystal 3 and the vibrating direction of the electric field irradiated by the electromagnetic wave generator 2. The constant K can be expressed by the following Equation 4 when CdTe is arranged as described above.

$$K = \lambda/(2\pi n_0^3 r_{41} d) \qquad \text{[Equation 4]}$$

Further, when detecting the electric field that vibrates parallel to the x (or z) axis by using CdTe, the crystallographic faces (110), (1(1 bar) 0), and (001) of CdTe are arranged perpendicularly to the x(z), y, and z(x) axes, respectively; then the polarization regulator 7 is adjusted so that the polarization axis of the linear polarization or the elliptical polarization may become parallel to the x(z) axis. In this case, a phase difference Γ expressed by the following Equation 5 arises between the polarized components that incline 45° to the x axis and the z axis.

$$\Gamma = (2\pi/\lambda) l n_o^3 r_{41} E \qquad \text{[Equation 5]}$$

Here, "l" represents the length [m] of the electro-optical crystal 3 in the direction of the light passage. Further, when SAR is defined by Equation 3, the constant K can be expressed by the following Equation 6.

$$K=\lambda/(2\pi l n_0^3 r_{41})$$ [Equation 6]

As described above, according to the specific absorption rate measuring system 40 of the embodiment, since the electric-field detecting element is constituted from dielectric materials, the disturbance to the electromagnetic field to be measured is removed, the disturbance conventionally being due to the aggregate of the short dipoles, and the disturbance being the problem with the conventional electric-field measuring method. The dielectric constants of the phantom 1 are prescribed by ARIB. Although reflection (Fresnel reflection) of the electromagnetic wave can arise at the interface between the phantom 1 and the electro-optical crystal 3 depending on the kind of the electro-optical crystal 3 according to the difference in the dielectric constants, such reflection is very small as compared with the disturbance due to the aggregate of short dipoles.

Figure 6:
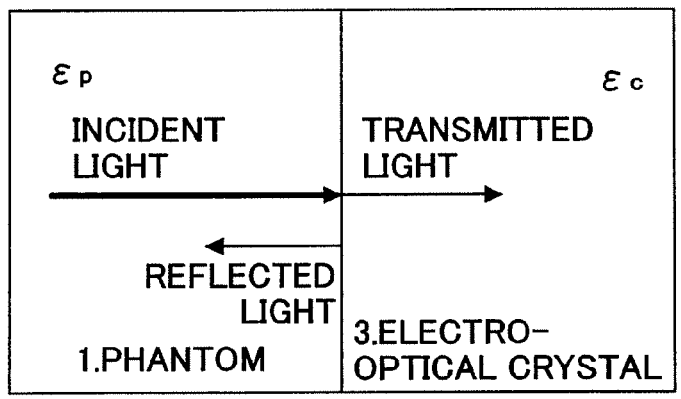
FIG. 6 gives a graph showing an error of field strength in an electro-optical crystal, the error being due to difference in dielectric constants.
Figure 6:
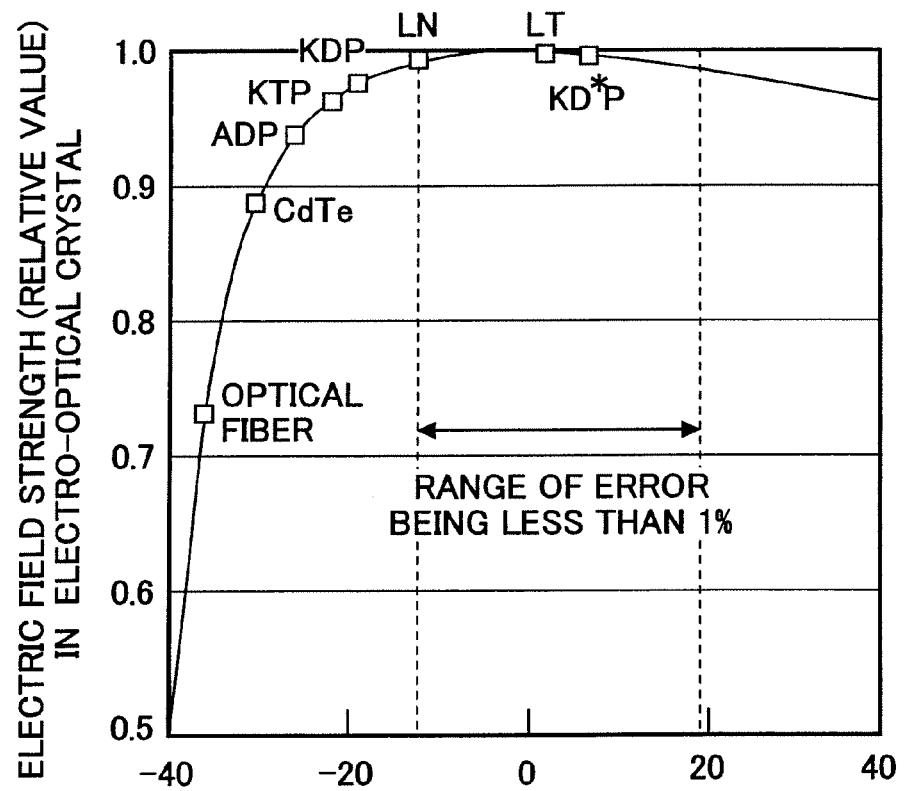

FIG. 6 shows the field strength in the electro-optical crystal 3 in consideration of the reflection at the interface when there is no absorption of the electromagnetic wave within the electro-optical crystal 3. In calculation, a model is assumed wherein the electromagnetic wave is perpendicularly provided to the electro-optical crystal 3 that is semi-infinite in size, and as the relative permittivity of the phantom, a value 40.5 at 1450 MHz that is specified by ARIB is used. Calculation results show that a true value can be obtained by compensating for the electric field that is measured by about 10% for the reflection in the case of CdTe. Further, it is considered that the influence on the measured electromagnetic field by the reflection is proportional to an area ratio that the electro-optical crystal 3 occupies. Given that the minimum spatial resolution of the SAR measurement is 1 mm, and that the minimum processing size of the electro-optical crystal 3 is about 100 µm, if the reflection factor per mm² is converted by the area ratio, it becomes about 1% of 1/100, which can practically be disregarded. It is also possible to measure SAR without compensation if electro-optical crystals that have a dielectric constant value approximately equal to the dielectric constant value of the phantom are used, such electro-optical crystals including LN, LT, and KD*P. The electrical properties of LN, LT, and KD*P and the error in the measured electric field due to the reflection are shown in Table 1.

TABLE 1

Electrical properties and error in measured electric field due to interface reflection of electro-optical crystals

| Electro-optical crystals | Pockels constant (×10⁻¹² m/V) | Relative permittivity | Error in measured electric field |
| --- | --- | --- | --- |
| LiNbO₃ (LN) | 19 | 28 | 0.8% |
| LiTaO₃ (LT) | 22 | 43 | <0.01% |
| KD₂PO₄ (KD*P) | 24.1 | 48 | <0.2% |

For the same reason, about 28% of reflection occurs at the bare fiber 10 that connects the optical-path switcher 9 and the electro-optical crystal 3, which reflection may cause a disturbance to the electromagnetic field to be measured. The diameter of a common bare fiber is 250 µm including a covering layer, and the reflection factor per mm² of the cross section is 1/16 (about 1.8%). The covering layer is provided in consideration of a micro bend property at low temperatures. However, since the bare fiber 10 of the specific absorption rate measuring system 40 according to the embodiment is covered by the phantom 1, a clad fiber having a diameter of 80 µm without a covering layer can be used. By using the clad fiber, the reflection factor per mm² can be lowered to 0.2% or less.

Figure 5:
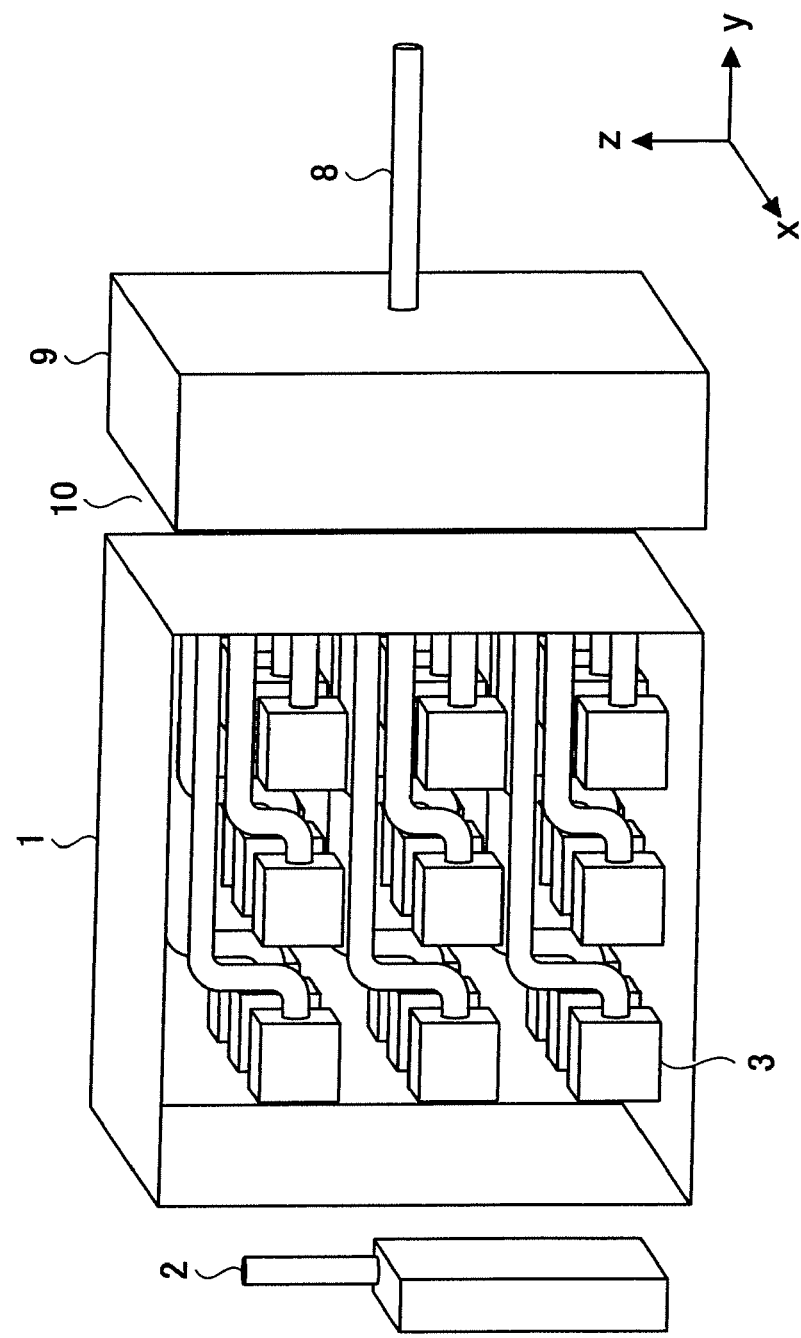
FIG. 5 is a perspective diagram showing a phantom according to the embodiment of the present invention.

With reference to FIG. 5, if N electro-optical crystals 3 are arranged in the direction of the y-axis, the number of the bare fibers 10 on the optical-path switcher 9 side per mm² is N, and the reflection factor per mm² becomes less than 0.2×N%. If the reflection factor is tolerated to be up to 10%, the number of the electro-optical crystals 3 that can be arranged in the direction of the y-axis becomes 50. If they are arranged at intervals of 1 mm, the length wherein the electro-optical crystals 3 are arranged in the direction of the y-axis is 50 mm. Since the size of the phantom that simulates the head is about 300 mm, the reflection by the optical-path switcher 9 may become great.

On the other hand, it is possible to prevent the reflection of the electromagnetic wave from occurring by applying a material having a great dielectric constant to the surface of the bare fibers 10, making the equivalent dielectric constant equal to the phantom. Since the direction of the main axis and sintering temperature can adjust the specific inductive capacity to a range between 40 and 120, TiO₂ and BaTiO₃ that have a sintering temperature lower than a softening temperature (about 1500° C.) of glass are suitable as the material to be applied.

Further, the present invention is not limited to these embodiments, but variations and modifications may be made without departing from the scope of the present invention.

What is claimed is:

1. A specific absorption rate measuring system for evaluating absorption of electromagnetic wave energy, comprising:
   a biological tissue equivalent phantom for absorbing electromagnetic wave energy;
   two or more electro-optical crystals that are arranged at two or more measurement points in the biological tissue equivalent phantom, the electro-optical crystals having a dielectric constant approximately equal to the dielectric constant of the biological tissue equivalent phantom;
   two or more optical fibers laid in the biological tissue equivalent phantom for coupling each of the electro-optical crystals to an external destination; and
   a specific absorption rate measurement unit configured to determine a specific absorption rate of the biological tissue equivalent phantom, based on the response of the electro-optical crystals conveyed thereto via the two or more optical fibers
   wherein the specific absorption rate measurement unit derives a specific absorption rate (SAR) of the biological tissue equivalent phantom, the SAR being defined by an equation that is a function of a conductivity σ of the biological tissue equivalent phantom, a density ρ of the biological tissue equivalent phantom, a constant K determined by the crystallographic axis of the electro-optical crystals, and a phase difference Γ.

* * * * *